United States Patent
Wang

(10) Patent No.: US 10,256,103 B2
(45) Date of Patent: Apr. 9, 2019

(54) FABRICATION METHOD FOR THIN FILM TRANSISTOR, THIN FILM TRANSISTOR AND DISPLAY APPARATUS

(71) Applicant: Wuhan China Star Optoelectronics Technology Co., Ltd., Wuhan, Hubei (CN)

(72) Inventor: Wei Wang, Guangdong (CN)

(73) Assignee: Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 0 days.

(21) Appl. No.: 15/546,711

(22) PCT Filed: Mar. 10, 2017

(86) PCT No.: PCT/CN2017/076355
§ 371 (c)(1),
(2) Date: Jul. 27, 2017

(87) PCT Pub. No.: WO2018/152875
PCT Pub. Date: Aug. 30, 2018

(65) Prior Publication Data
US 2018/0277376 A1 Sep. 27, 2018

(30) Foreign Application Priority Data
Feb. 27, 2017 (CN) .......................... 2017 1 0109609

(51) Int. Cl.
*H01L 21/30* (2006.01)
*H01L 27/12* (2006.01)
(Continued)

(52) U.S. Cl.
CPC ........ *H01L 21/3003* (2013.01); *H01L 27/127* (2013.01); *H01L 27/1222* (2013.01);
(Continued)

(58) Field of Classification Search
CPC ............. H01L 27/1251; H01L 27/1255; H01L 29/0615; H01L 29/0619; H01L 29/0623
See application file for complete search history.

(56) References Cited

U.S. PATENT DOCUMENTS

2010/0270541 A1* 10/2010 Liu .................... H01L 27/1214
257/40
2014/0299842 A1* 10/2014 Kim .................. H01L 29/78678
257/40
(Continued)

FOREIGN PATENT DOCUMENTS

CN 102315230 A 1/2012
CN 103107095 A 5/2013
(Continued)

*Primary Examiner* — Ermias T Woldegeorgis
(74) *Attorney, Agent, or Firm* — Andrew C. Cheng

(57) ABSTRACT

The present application discloses a method for fabricating a thin film transistor including the steps of: sequentially forming an active layer, a gate insulating layer, a gate, and a capacitive insulating layer on a substrate, the gate insulating layer isolating the active layer from the gate; a hydrogen-blocking layer is formed on the side of the capacitive insulating layer facing away from the substrate, and the hydrogen-blocking layer covering the capacitive insulating layer; and performing hydrogenation treatment to the gate insulating layer and the active layer. The present application also discloses a thin film transistor and a display apparatus. In improving the flexibility of the AMOLED display apparatus while ensuring the hydrogenation effect of the polysilicon thin film transistor, the fabricated thin film transistor has high electron mobility, and the display apparatus has a good display performance.

14 Claims, 3 Drawing Sheets

(51) Int. Cl.

| | | |
|---|---|---|
| *H01L 29/786* | (2006.01) | |
| *H01L 29/66* | (2006.01) | |
| *H01L 49/02* | (2006.01) | |
| *H01L 27/32* | (2006.01) | |
| *H01L 51/00* | (2006.01) | |
| *H01L 29/06* | (2006.01) | |

(52) U.S. Cl.
CPC ...... *H01L 27/1251* (2013.01); *H01L 27/1255* (2013.01); *H01L 27/1259* (2013.01); *H01L 27/3244* (2013.01); *H01L 28/60* (2013.01); *H01L 29/66757* (2013.01); *H01L 29/78675* (2013.01); *H01L 27/3262* (2013.01); *H01L 29/0615* (2013.01); *H01L 29/0619* (2013.01); *H01L 29/0623* (2013.01); *H01L 51/0097* (2013.01); *H01L 2251/5338* (2013.01)

(56) References Cited

U.S. PATENT DOCUMENTS

| | | | | |
|---|---|---|---|---|
| 2016/0027814 | A1* | 1/2016 | Jin | ............... H01L 27/1255 |
| | | | | 257/296 |
| 2016/0163746 | A1* | 6/2016 | Ko | ............... H01L 27/3265 |
| | | | | 438/39 |

FOREIGN PATENT DOCUMENTS

| | | |
|---|---|---|
| CN | 204464283 U | 7/2015 |
| CN | 104821338 A | 8/2015 |

\* cited by examiner

FABRICATION METHOD FOR THIN FILM TRANSISTOR, THIN FILM TRANSISTOR AND DISPLAY APPARATUS

CROSS REFERENCE

This application claims priority to Chinese Patent Application No. 20171010 9609.6, entitled "FABRICATION METHOD FOR THIN FILM TRANSISTOR, THIN FILM TRANSISTOR and display apparatus" filed on Feb. 27, 2017, which is incorporated by reference in its entirety.

FIELD OF THE INVENTION

The present application relates to a fabrication method for liquid crystal technology field, and more particularly to a fabrication method for thin film transistor, thin film transistor and display apparatus.

BACKGROUND OF THE INVENTION

With the development of display technology and the increasingly high demand of the appearance performance and other aspects of the display device by the users, the flexible display of active matrix organic light emitting diode, AMOLED came into being. During the fabrication of thin film transistors, the hydrogenation process is needed, taking the array structure display panel adapting low-temperature polysilicon, LTPS thin film transistor as an example, the polysilicon thin film transistor is hydrogenation during the production to improve the electronics mobility of the polysilicon thin film transistor, repair defects, so that the polysilicon thin film transistor has a high carrier mobility, which has become the first choice of production the small size high-resolution panel. Specifically, the capacitive insulation layer and interlayer insulation layer of the polysilicon thin film transistor is taken as the hydrogen-donating layer, and the high temperature annealing process in 590° C., 10 min is adapted to achieve the hydrogenation treatment of the array substrate. In the field of liquid crystal display, LCD and rigid AMOLED, the adaption of LTPS array structure display panel and its fabricating process has become more mature, but the polysilicon thin film transistor in the manufacture and application of flexible AMOLED display apparatus is still immature.

In the conventional technology, in order to improve the flexibility effect, the capacitive insulating layer and the interlayer insulating layer are generally designed as an inorganic layer having a small thickness, and the hydrogenation treatment is required to rely on the inorganic layer to supply hydrogen atoms, and the amount of the hydrogen atoms provided by the thinner inorganic layer itself is relatively few, in the high-temperature hydrogenation process, some of the hydrogen atoms diffuse outward but did not play the role of hydrogenation, the content of the hydrogen in the hydrogenation process is insufficient to cause the hydrogenation effect to be poor, that is, it cannot improve the flexibility of AMOLED display apparatus while ensuring the hydrogenation effect of the polysilicon thin film transistor. The electron mobility of the produced polysilicon thin film transistor is low and the display device has poor display performance.

SUMMARY OF THE INVENTION

In view of the above, the present application provides a method of fabricating a thin film transistor, a thin film transistor and a display apparatus, and is capable of ensuring the hydrogenation treatment effect of the thin film transistor while improving the flexibility of the AMOLED display apparatus.

A method for fabricating a thin film transistor, including:
forming an active layer, a gate insulating layer, a gate, and a capacitive insulating layer sequentially on the substrate, the gate insulating layer isolating the active layer from the gate;
forming a hydrogen-blocking layer on the side of the capacitive insulating layer facing away from the substrate, and the hydrogen-blocking layer covering the capacitive insulating layer; and
performing hydrogenation treatment to the gate insulating layer and the active layer.
wherein the temperature of the hydrogenation treatment is not more than 500° C. and the duration of the hydrogenation treatment is not more than 60 minutes.
wherein the hydrogen-blocking layer is a conductive material, and after the step of performing hydrogenation treatment to the gate insulating layer and the active layer, the method further including: patterning the hydrogen-blocking layer to form a capacitive upper electrode.
wherein after the step of performing hydrogenation treatment to the gate insulating layer and the active layer, the method further including: depositing a conductive material on a side of the surface of the hydrogen-blocking layer facing away from the substrate, and patterning the conductive material to form the capacitive upper electrode
wherein after forming the capacitive upper electrode, an interlayer insulating layer is formed on a side of the surface of the capacitive upper electrode facing away from the substrate, and a source and a drain are formed on the surface of the interlayer insulating layer.
wherein after forming the capacitive upper electrode, an interlayer insulating layer is formed on a side of the surface of the capacitive upper electrode facing away from the substrate, and a source and a drain are formed on the surface of the interlayer insulating layer.
A thin film transistor, including: a substrate and an active layer, a gate insulating layer, a gate, and a capacitive insulating layer sequentially formed on a side of the substrate, wherein the thin film transistor further including a hydrogen-blocking layer, and the hydrogen-blocking layer is disposed on a side of the capacitive insulating layer facing away from the substrate, and covering the capacitive insulating layer; and the hydrogen-blocking layer is for blocking the outwardly diffusion of the hydrogen ions provided by the capacitive insulating layer during the hydrogenation treatment.
wherein the thin film transistor further including a capacitive upper electrode, an interlayer insulating layer, a source, and a drain disposed on the side of the hydrogen-blocking layer facing away from the substrate, and the interlayer insulating layer isolates the capacitive upper electrode from the source and the drain on both sides of the interlayer insulating layer.
wherein the interlayer insulating layer is an organic material film layer.
wherein the hydrogen-blocking layer is an inorganic material film layer or a metal material film layer.
A display apparatus, including a thin film transistor, the thin film transistor including: a substrate and an active layer, a gate insulating layer, a gate, and a capacitive insulating layer sequentially formed on a side of the substrate, wherein the thin film transistor further including a hydrogen-blocking layer, and the hydrogen-blocking layer is disposed on a side of the capacitive insulating layer facing away from the substrate, and covering the capacitive insulating layer; and the hydrogen-blocking layer is for blocking the outwardly diffusion of the hydrogen ions provided by the capacitive insulating layer during the hydrogenation treatment.

wherein the thin film transistor further including a capacitive upper electrode, an interlayer insulating layer, a source, and a drain disposed on the side of the hydrogen-blocking layer facing away from the substrate, and the interlayer insulating layer isolates the capacitive upper electrode from the source and the drain on both sides of the interlayer insulating layer.

wherein the interlayer insulating layer is an organic material film layer.

wherein the hydrogen-blocking layer is an inorganic material film layer or a metal material film layer.

Thus, the method of fabricating the thin film transistor of the present application, the thin film transistor and the display apparatus, the capacitive insulating layer providing hydrogen atoms for the hydrogenation treatment of the active layer and the gate insulating layer, the hydrogen-blocking layer blocks the outwardly diffused hydrogen atoms during the high-temperature hydrogenation to increase the utilization rate of the hydrogen atoms, and increases the hydrogen atoms involved in the hydrogenation treatment of the active layer and the gate insulating layer 30, improving the hydrogenation effect, when the thin film transistor applied in the AMOLED flexible display apparatus, the substrate is a flexible substrate, the total amount of the hydrogen atoms need to be provided can be reduced, by the enhancement of the hydrogenation efficiency, that is the thickness of the capacitive insulating layer to provide the hydrogen atoms can be reduced, the smaller thickness of the capacitive insulating layer, the better the flexibility of the flexible display apparatus, thereby improving the flexibility of the AMOLED display apparatus while ensuring the hydrogenation effect of the polysilicon thin film transistor, the electron mobility of the fabricated polysilicon thin film transistor is high and the display performance of the display device is good.

BRIEF DESCRIPTION OF THE DRAWINGS

In order to more clearly illustrate the embodiments of the present application or conventional technology, the following FIGS. will be described in the embodiments are briefly introduced. It is obvious that the drawings are merely some embodiments of the present application, those of ordinary skill in this field can obtain other FIG.s according to these FIG.s without paying the premise.

DETAILED DESCRIPTION OF PREFERRED EMBODIMENTS

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts acquired should be considered within the scope of protection of the present application.

Specifically, the terminologies in the embodiments of the present application are merely for describing the purpose of the certain embodiment, but not to limit the invention.

Figure 1:
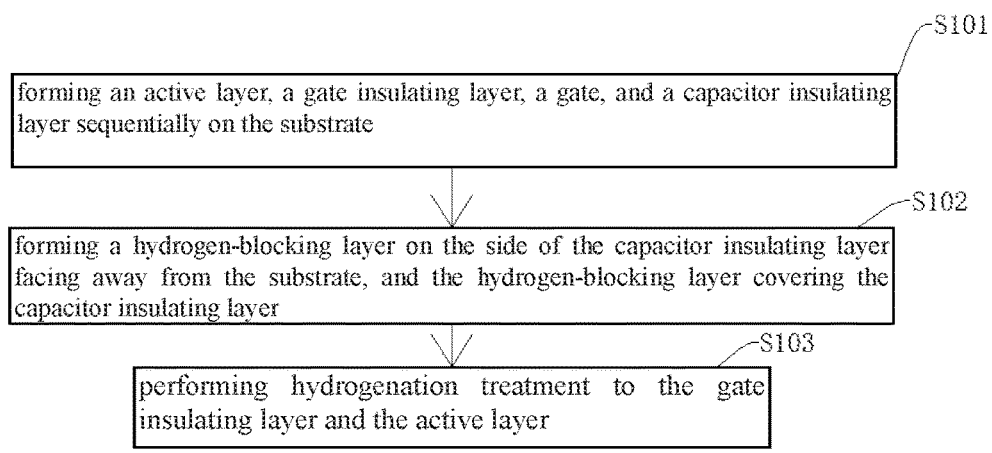
FIG. 1 is a flow chart of a method for fabricating a thin film transistor according to a first embodiment of the present application.
Figure 2:
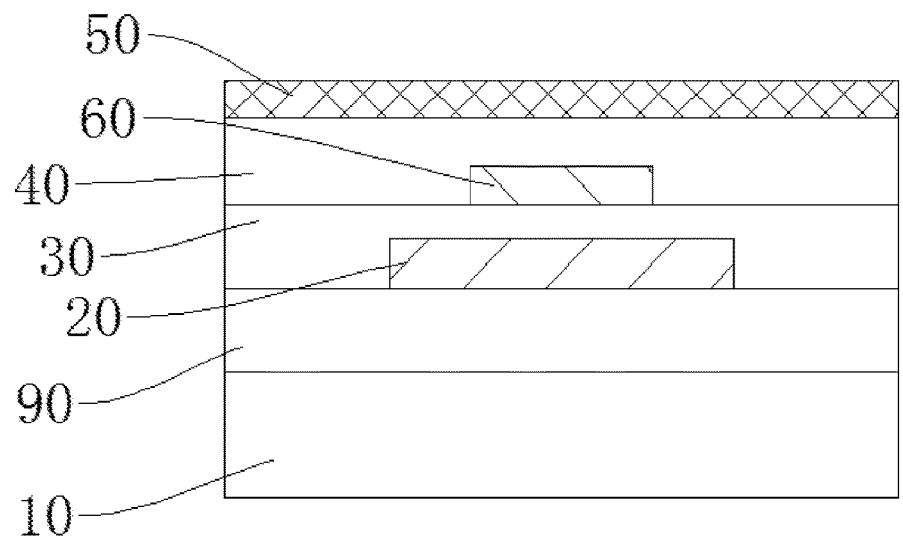
FIG. 2 is a schematic view showing a step S102 of method for fabricating the thin film transistor according to the first embodiment of the present application.
Figure 3:
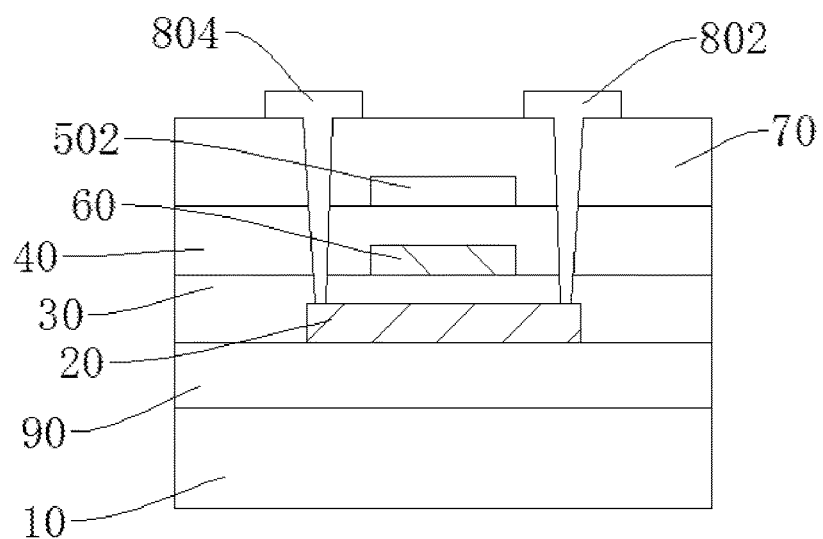
FIG. 3 is a schematic view showing a step S103 of method for fabricating the thin film transistor according to the first embodiment of the present application.

Referring to FIGS. 1, 2 and 3, the method of fabricating a thin film transistor according to the first embodiment of the present application includes:

S101, forming an active layer 20, a gate insulating layer 30, a gate 60, and a capacitive insulating layer 40 sequentially on the substrate 10.

The substrate 10 is a carrier for a monolithic structure of the thin film transistor, and the substrate 10 is generally made of a plastic material or a glass material. In the present embodiment, in order to improve the flexible display effect, and is suitable for an AMOLED flexible display, the substrate 10 is a flexible substrate. In a preferred embodiment, the substrate 10 is made of plastic material, the plastic material is soft and easy to be bended, and with low material cost.

In the present embodiment, a barrier layer 90 is formed on the surface of the substrate 10 before the active layer 20 is formed on the substrate 10, the barrier layer 90 is located between the substrate 10 and the active layer 20. The barrier layer 90 is formed by a method such as chemical vapor deposition or physical deposition, which the material is excellent in electrical insulating properties. The barrier layer 90, also known as a buffer layer is used to prevent the metal ions (Aluminum, Barium, Sodium, etc.) in the glass from diffusing into the active layer 20 in the thermal process, and the quality of the surface of the polysilicon can be improved by adjusting the thickness or deposition conditions of the barrier layer 90, and is conducive to reducing the heat conduction, slowing the cooling rate of silicon after heating, conducive to the crystallization of silicon.

Further, the active layer 20 is formed on the surface of the barrier layer 90. Specifically, the active layer 20 forms a thin film on the surface of the barrier layer 90 by plasma enhanced chemical vapor deposition, PECVD, and the thin film is patterned to form the active layer 20. In the present embodiment, the active layer 20 is formed by a polysilicon material to produce a polysilicon thin film transistor having better conductivity and softness, but the present application is not limited to a polysilicon thin film transistor. The polysilicon material has a semiconductor property and is an extremely important excellent semiconductor material. Therefore, the active layer 20 formed of the polysilicon thin film has good unidirectional conductivity and is used for connecting a source 802 and a drain 804 which are to be produced in succession, and making the source 802 and the drain 804 electrically connected.

In the present embodiment, the gate insulating layer 30 is formed on the surface of the active layer 20, specifically, the gate insulating layer 30 is formed by plasma enhanced chemical vapor deposition of SiO2. Further, a gate 60 is formed on the surface of the gate insulating layer 30 facing away from the side of the active layer 20, and a metal film is formed on the surface of the gate insulating layer 30 by sputtering or depositing a metal material, and etching is performed by photolithography to pattern the metal layer to form the gate 60. The gate insulating layer 30 is located between the gate 60 and the active layer 20 to isolate the gate 60 from the active layer 20, and preventing shorting of the gate 60 and the active layer 20. Further, the capacitive insulating layer 40 is formed on the surface of the gate 60 by chemical vapor deposition or physical deposition. On the one hand, the capacitive insulating layer 40 is used to isolate the gate 60 from the capacitive upper electrode 402, which is subsequent formed on the gate 60, on the other hand, the capacitive insulating layer 40 serves as a hydrogen-donating layer to provide a hydrogen atom for the subsequent hydrogenation process.

S102, forming a hydrogen-blocking layer 50 on the side of the capacitive insulating layer 40 facing away from the substrate 10, and the hydrogen-blocking layer 50 covering the capacitive insulating layer 40.

In the present embodiment, the hydrogen-blocking layer 50 is a dense inorganic material film layer or a metal film layer such as $Al_2O_3$. The hydrogen-blocking layer 50 is formed on the surface of the capacitive insulating layer 40 by chemical vapor deposition or physical deposition or sputtering, and completely covers the capacitive insulating layer 40.

S103, performing hydrogenation treatment to the gate insulating layer 30 and the active layer 20.

Specifically, the temperature of the hydrogenation treatment is not more than 500° C. and the duration of the hydrogenation treatment is not more than 60 minutes. In a preferred embodiment, the gate insulating layer 30 and the active layer 20 are treated for 60 minutes at a hydrogenation temperature of 400° C. There is a grain boundary between the polysilicon grains, and there is an interface between the polysilicon (active layer 20) and the oxide layer (gate insulating layer 30), which affects the electrical properties of the polysilicon thin film transistor. The hydrogenation treatment uses hydrogen atoms to fill the unbound bonds, grain boundaries, oxide layer defects and interface states of polysilicon atoms, thereby reducing the number of unstable states, enhancing electron mobility, conductivity and threshold voltage uniformity.

The capacitive insulating layer 40 provides a hydrogen atom for the hydrogenation treatment, reducing the thickness of the capacitive insulating layer 40 to increase the flexibility of the flexible display, but reduces the number of hydrogen atoms that the capacitive insulating layer 40 can provide. The hydrogen-blocking layer 50 prevents the hydrogen atoms from diffusing outwardly, and the hydrogen-blocking layer 50 blocks the outwardly diffused hydrogen atoms during the high-temperature hydrogenation to increase the utilization rate of the hydrogen atoms, and increases the hydrogen atoms involved in the hydrogenation treatment of the active layer 20 and the gate insulating layer 30, improving the hydrogenation effect, and improving the flexibility of the AMOLED display apparatus while ensuring the hydrogenation effect of the polysilicon thin film transistor, the electron mobility of the fabricated polysilicon thin film transistor is high and the display performance of the display device is good.

In the present embodiment, the hydrogen-blocking layer 50 is a conductive material, such as a metal or the like, after the hydrogenation treatment, the hydrogen-blocking layer 50 is patterned to form the capacitive upper electrode 402. Specifically, the way to pattern the hydrogen-blocking layer 50 is by photolithography or other etching methods. The capacitive upper electrode 402 and the gate 60 are separated by the capacitive insulating layer 40 to prevent shorting of the capacitive upper electrode 402 and the insulating layer. The hydrogen-blocking layer 50 completely covers the capacitive insulating layer 40 before patterning, and has the function of blocking the outwardly diffusion of the hydrogen atoms provided by the capacitive insulating layer 40, the hydrogen-blocking layer 50 is patterned to form the capacitive upper electrode 402, there is no other film added during the fabrication process of the polysilicon thin film transistor, the thickness of the fabricated polysilicon thin film transistor is small, soft and easy to be bended, improving the flexibility of AMOLED display apparatus while improving the hydrogenation effect of the polysilicon thin film transistor.

In the present embodiment, after forming the capacitive upper electrode 402, an interlayer insulating layer 70 is formed and covered on the surface of the capacitive upper electrode 402 facing away from the substrate 10, and the source 802 and the drain 804 are formed on the surface of the interlayer insulating layer 70. The organic material is soft and the bending property is good, and since the hydrogen atoms provided by the capacitive insulating layer 40 is sufficiently to complete the hydrogenation treatment of the active layer 20 and the gate insulating layer 30, compared to the conventional technology, the interlayer insulating layer 70 and the capacitive insulating layer 40 is adapted an inorganic material to provide hydrogen atoms, the interlayer insulating layer 70 of the polysilicon thin film transistor provided in the present embodiment does not need to provide hydrogen atoms, so that the organic material having better bending properties can be used, in the premise of satisfying sufficiently hydrogenation treatment, the flexibility of the AMOLED display apparatus is greatly improved. The source 802 and the drain 804 are formed on the surface of the interlayer insulating layer 70, and the interlayer insulating layer 70 isolates the capacitive upper electrode 402 from the source 802 and the drain 804 to prevent shorting of the source 802 and the drain 804 from the capacitive upper electrode 402. Further, the source 802 and the drain 804 sequentially pass through the interlayer insulating layer 70, the capacitive insulating layer 40, and the gate insulating layer 30 to connect to the active layer 20 to realize the electrical connection between the source and the drain.

The capacitive insulating layer 40 provides hydrogen atoms for the hydrogenation treatment of the active layer 20 and the gate insulating layer 30, the hydrogen-blocking layer 50 blocks the outwardly diffused hydrogen atoms during the high-temperature hydrogenation to increase the utilization rate of the hydrogen atoms, and increases the hydrogen atoms involved in the hydrogenation treatment of the active layer 20 and the gate insulating layer 30, improving the hydrogenation effect, and improving the flexibility of the AMOLED display apparatus while ensuring the hydrogenation effect of the polysilicon thin film transistor, the electron mobility of the fabricated polysilicon thin film transistor is high and the display performance of the display device is good.

Figure 4:
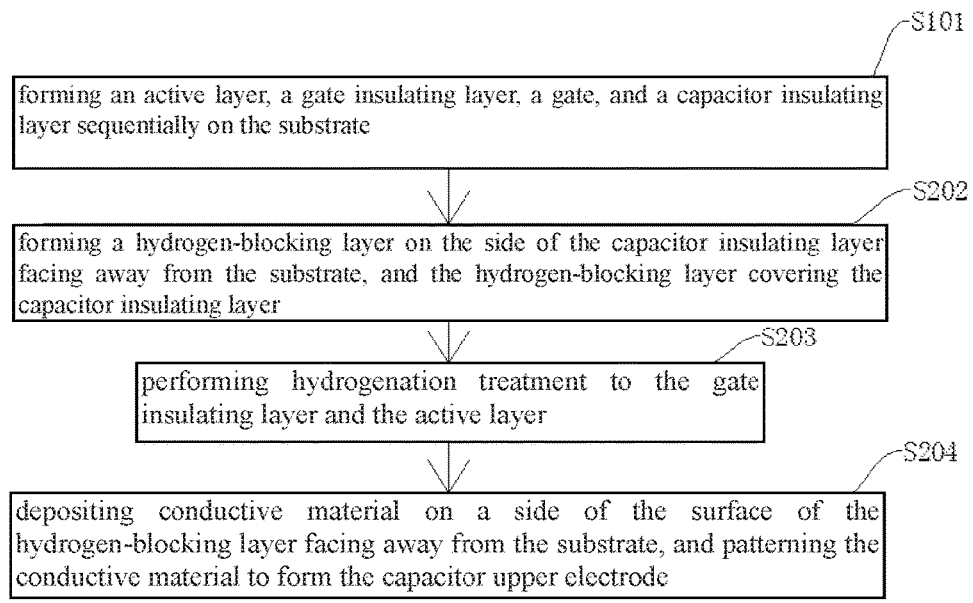
FIG. 4 is a flow chart showing a method of fabricating a thin film transistor according to a second embodiment of the present application.

Referring to FIG. 4, the method of fabricating a thin film transistor according to the second embodiment of the present application includes:

S201, forming an active layer 20, a gate insulating layer 30, a gate 60, and a capacitive insulating layer 40 sequentially on the substrate 10.

The substrate 10 is a carrier for a monolithic structure of the thin film transistor, and the substrate 10 is generally made of a plastic material or a glass material. In the present embodiment, in order to improve the flexible display effect, and is suitable for an AMOLED flexible display, the substrate 10 is a flexible substrate. In a preferred embodiment, the substrate 10 is made of plastic material, the plastic material is soft and easy to be bended, and with low material cost.

In the present embodiment, a barrier layer 90 is formed on the surface of the substrate 10 before the active layer 20 is formed on the substrate 10, the barrier layer 90 is located between the substrate 10 and the active layer 20. The barrier layer 90 is formed by a method such as chemical vapor deposition or physical deposition, which the material is excellent in electrical insulating properties. The barrier layer 90, also known as a buffer layer, is used to prevent the metal ions (Aluminum, Barium, Sodium, etc.) in the glass from diffusing into the active layer 20 in the thermal process, and the quality of the surface of the polysilicon can be improved by adjusting the thickness or deposition conditions of the barrier layer 90, and is conducive to reducing the heat conduction, slowing the cooling rate of silicon after heating, conducive to the crystallization of silicon.

Further, the active layer 20 is formed on the surface of the barrier layer 90. Specifically, the active layer 20 forms a thin film on the surface of the barrier layer 90 by plasma enhanced chemical vapor deposition, PECVD, and the thin film is patterned to form the active layer 20. In the present embodiment, the active layer 20 is formed by a polysilicon material to produce a polysilicon thin film transistor having better conductivity and softness, but the present application is not limited to a polysilicon thin film transistor. The polysilicon material has a semiconductor property and is an extremely important excellent semiconductor material. Therefore, the active layer 20 formed of the polysilicon thin film has good unidirectional conductivity and is used for connecting the source 802 and the drain 804 which are to be produced in succession, and making the source 802 and the drain 804 electrically connected.

In the present embodiment, the gate insulating layer 30 is formed on the surface of the active layer 20, specifically, the gate insulating layer 30 is formed by plasma enhanced chemical vapor deposition of SiO2. Further, the gate 60 is formed on the surface of the gate insulating layer 30 facing away from the side of the active layer 20, and the metal film is formed on the surface of the gate insulating layer 30 by sputtering or depositing a metal material, and etching is performed by photolithography to pattern the metal layer to form the gate 60. The gate insulating layer 30 is located between the gate 60 and the active layer 20 to isolate the gate 60 from the active layer 20, and preventing shorting of the gate 60 and the active layer 20. Further, the capacitive insulating layer 40 is formed on the surface of the gate 60 by chemical vapor deposition or physical deposition. On the one hand, the capacitive insulating layer 40 is used to isolate the gate 60 from the capacitive upper electrode 402, which is subsequent formed on the gate 60, on the other hand, the capacitive insulating layer 40 serves as a hydrogen-donating layer to provide a hydrogen atom for the subsequent hydrogenation process.

S202, forming a hydrogen-blocking layer 50 on the side of the capacitive insulating layer 40 facing away from the substrate 10, and the hydrogen-blocking layer 50 covers the capacitive insulating layer 40.

In the present embodiment, the hydrogen-blocking layer 50 is a dense inorganic material film layer or a metal film layer such as $Al_2O_3$. The hydrogen-blocking layer 50 is formed on the surface of the capacitive insulating layer 40 by chemical vapor deposition or physical deposition or sputtering, and completely covers the capacitive insulating layer 40.

S303, performing hydrogenation treatment to the gate insulating layer 30 and the active layer 20.

Specifically, the temperature of the hydrogenation treatment is not more than 500° C. and the duration of the hydrogenation treatment is not more than 60 minutes. In a preferred embodiment, the gate insulating layer 30 and the active layer 20 are treated for 60 minutes at a hydrogenation temperature of 400° C. There is a grain boundary between the polysilicon grains, and there is an interface between the polysilicon (active layer 20) and the oxide layer (gate insulating layer 30), which affects the electrical properties of the polysilicon thin film transistor. The hydrogenation treatment uses hydrogen atoms to fill the unbound bonds, grain boundaries, oxide layer defects and interface states of polysilicon atoms, thereby reducing the number of unstable states, enhancing electron mobility, conductivity and threshold voltage uniformity.

The capacitive insulating layer 40 provides a hydrogen atom for the hydrogenation treatment, reducing the thickness of the capacitive insulating layer 40 to increase the flexibility of the flexible display, but reduces the number of hydrogen atoms that the capacitive insulating layer 40 can provide. The hydrogen-blocking layer 50 prevents the hydrogen atoms from diffusing outwardly, and the hydrogen-blocking layer 50 blocks the outwardly diffused hydrogen atoms during the high-temperature hydrogenation to increase the utilization rate of the hydrogen atoms, and increases the hydrogen atoms involved in the hydrogenation treatment of the active layer 20 and the gate insulating layer 30, improving the hydrogenation effect, and improving the flexibility of the AMOLED display apparatus while ensuring the hydrogenation effect of the polysilicon thin film transistor, the electron mobility of the fabricated polysilicon thin film transistor is high and the display performance of the display device is good.

S204, depositing conductive material on a side of the surface of the hydrogen-blocking layer 50 facing away from the substrate 10, and patterning the conductive material to form the capacitive upper electrode 402.

In the present embodiment, the method for patterning is photolithography or other etching method. The capacitive upper electrode 402 and the gate 60 are separated by the capacitive insulating layer 40 and the hydrogen-blocking layer 50 to prevent shorting of the capacitive upper electrode 402 from the insulating layer. The fabricating process of the hydrogen-blocking layer 50 has the function of blocking the outwardly diffusion of the hydrogen atoms provided by the capacitive insulating layer 40, and it does not affect the structure and characteristics of other layers in the polysilicon thin film transistor, the fabricating method is simple, with good flexible, and with small impact to the overall process of the polysilicon thin film transistor, the thickness of the fabricated polysilicon thin film transistor is small, soft and easy to be bended, 402 improving the flexibility of AMOLED display apparatus while improving the hydrogenation effect of the polysilicon thin film transistor.

In the present embodiment, after forming the capacitive upper electrode 402, an interlayer insulating layer 70 is formed and covered on the surface of the capacitive upper electrode 402 facing away from the substrate 10, and the source 802 and the drain 804 are formed on the surface of the interlayer insulating layer 70. The organic material is soft and the bending property is good, and since the hydrogen atoms provided by the capacitive insulating layer 40 is sufficiently to complete the hydrogenation treatment of the active layer 20 and the gate insulating layer 30, compared to the conventional technology, the interlayer insulating layer 70 and the capacitive insulating layer 40 is adapted an inorganic material to provide hydrogen atoms, the interlayer insulating layer 70 of the polysilicon thin film transistor provided in the present embodiment does not need to provide hydrogen atoms, so that the organic material having better bending properties can be used, in the premise of satisfying sufficiently hydrogenation treatment, the flexibility of the AMOLED display apparatus is greatly improved. The source 802 and the drain 804 are formed on the surface of the interlayer insulating layer 70, and the interlayer insulating layer 70 isolates the capacitive upper electrode 402 from the source 802 and the drain 804 to prevent shorting of the source 802 and the drain 804 from the capacitive upper electrode 402. Further, the source 802 and the drain 804 sequentially pass through the interlayer insulating layer 70, the capacitive insulating layer 40, and the gate insulating layer 30 to connect to the active layer 20 to realize the electrical connection between the source and the drain.

The capacitive insulating layer 40 provides hydrogen atoms for the hydrogenation treatment of the active layer 20 and the gate insulating layer 30, the hydrogen-blocking layer 50 blocks the outwardly diffused hydrogen atoms during the high-temperature hydrogenation to increase the utilization rate of the hydrogen atoms, and increases the hydrogen atoms involved in the hydrogenation treatment of the active layer 20 and the gate insulating layer 30, improving the hydrogenation effect, and improving the flexibility of the AMOLED display apparatus while ensuring the hydrogenation effect of the polysilicon thin film transistor, the electron mobility of the fabricated polysilicon thin film transistor is high and the display performance of the display device is good.

Figure 5:
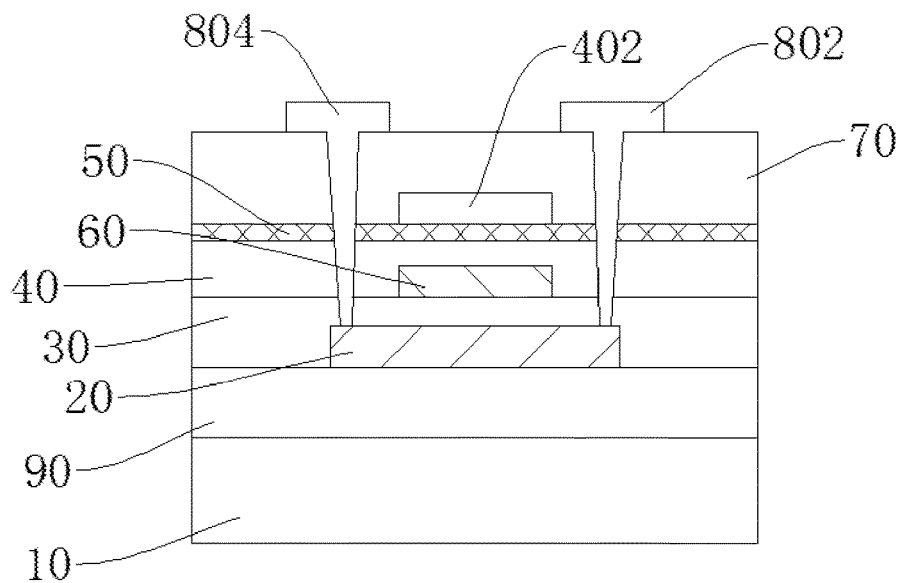
FIG. 5 is a schematic diagram of the thin film transistor according to the present embodiment.

Referring to FIG. 5, the thin film transistor provided in the embodiment of the present application includes the substrate 10 and the active layer 20, the gate insulating layer 30, the gate 60, and the capacitive insulating layer 40 sequentially disposed on one side of the substrate 10. In this embodiment, the polysilicon material is adopted to form the active layer 20 to produce the polysilicon thin film transistor having better conductivity and softness, but the present application is not limited to a polysilicon thin film transistor. The thin film transistor also includes a hydrogen-blocking layer 50, the hydrogen-blocking layer 50 is located on the side of the capacitive insulating layer 40 away from the substrate 10 and covers the capacitive insulating layer 40, the hydrogen-blocking layer 50 is for blocking the outwardly diffusion of the hydrogen ions provided by the capacitive insulating layer during the hydrogenation treatment. In a preferred embodiment, the hydrogen-blocking layer 50 is an inorganic material film layer or a metal material film layer, such as $Al_2O_3$. The hydrogen-blocking layer 50 is formed on the surface of the capacitive insulating layer 40 by chemical vapor deposition or physical deposition or sputtering, and completely covers the capacitive insulating layer 40. The capacitive insulating layer 40 provides hydrogen atoms for the hydrogenation treatment, reducing the thickness of the capacitive insulating layer 40 can improve the flexibility of the flexible display, but reduces the number of hydrogen atoms that the capacitive insulating layer 40 can provide. The hydrogen-blocking layer 50 prevents the hydrogen atoms from diffusing outwardly, and the hydrogen-blocking layer 50 blocks the outwardly diffused hydrogen atoms during the high-temperature hydrogenation to increase the utilization rate of the hydrogen atoms, and increases the hydrogen atoms involved in the hydrogenation treatment of the active layer 20 and the gate insulating layer 30, improving the hydrogenation effect, and improving the flexibility of the AMOLED display apparatus while ensuring the hydrogenation effect of the polysilicon thin film transistor, the electron mobility of the fabricated polysilicon thin film transistor is high and the display performance of the display device is good.

In the present embodiment, the thin film transistor further includes the capacitive upper electrode 402, the interlayer insulating layer 70, the source 802, and the drain 804 disposed on the side of the hydrogen-blocking layer 50 facing away from the substrate 10, and the interlayer insulating layer 70 isolates the capacitive upper electrode 402, the source 802 and the drain 804 on both sides of the interlayer insulating layer 70. Specifically, the capacitive upper electrode 402 and the gate 60 are separated by the capacitive insulating layer 40 and the hydrogen-blocking layer 50 to prevent shorting of the capacitive upper electrode 402 from the insulating layer. Further, the interlayer insulating layer 70 is disposed on the surface of the capacitive upper electrode 402 facing away from the substrate 10, and the source 802 and the drain 804 are formed on the surface of the interlayer insulating layer 70. In a preferred embodiment, the interlayer insulating layer 70 is an organic material film layer, the organic material is soft and the bending property is good, since the hydrogen atoms provided by the capacitive insulating layer 40 are sufficient to complete the hydrogenation treatment to the active layer 20 and the gate insulating layer 30, compared to the conventional technology, the interlayer insulating layer 70 and the capacitive insulating layer 40 is adapted an inorganic material to provide hydrogen atoms, the interlayer insulating layer 70 of the polysilicon thin film transistor provided in the present embodiment does not need to provide hydrogen atoms, so that the organic material having better bending properties can be used, in the premise of satisfying sufficiently hydrogenation treatment, the flexibility of the AMOLED display apparatus is greatly improved. The source 802 and the drain 804 are formed on the surface of the interlayer insulating layer 70, and the interlayer insulating layer 70 isolates the capacitive upper electrode 402 from the source 802 and the drain 804 to prevent shorting of the source 802 and the drain 804 from the capacitive upper electrode 402. Further, the source 802 and the drain 804 sequentially pass through the interlayer insulating layer 70, the capacitive insulating layer 40, and the gate insulating layer 30 to connect to the active layer 20 to realize the electrical connection between the source and the drain.

The capacitive insulating layer 40 provides hydrogen atoms for the hydrogenation treatment of the active layer 20 and the gate insulating layer 30, the hydrogen-blocking layer 50 blocks the outwardly diffused hydrogen atoms during the high-temperature hydrogenation to increase the utilization rate of the hydrogen atoms, and increases the hydrogen atoms involved in the hydrogenation treatment of the active layer 20 and the gate insulating layer 30, improving the hydrogenation effect, and improving the flexibility of the AMOLED display apparatus while ensuring the hydrogenation effect of the polysilicon thin film transistor, the electron mobility of the fabricated polysilicon thin film transistor is high and the display performance of the display device is good.

The present embodiment also provides a display apparatus including the thin film transistor described above. Specifically, the display apparatus is an AMOLED flexible display apparatus. The thin film transistor is positioned in the array substrate of the display apparatus, and the driving voltage of each pixel electrode is controlled by controlling the on-off state of the thin film transistor so as to control the light emission state of the organic light emitter of each pixel unit and control the display apparatus to display image.

The capacitive insulating layer 40 provides hydrogen atoms for the hydrogenation treatment of the active layer 20 and the gate insulating layer 30, the hydrogen-blocking layer 50 blocks the outwardly diffused hydrogen atoms during the high-temperature hydrogenation to increase the utilization rate of the hydrogen atoms, and increases the hydrogen atoms involved in the hydrogenation treatment of the active layer 20 and the gate insulating layer 30, improving the hydrogenation effect, and improving the flexibility of the AMOLED display apparatus while ensuring the hydrogenation effect of the polysilicon thin film transistor, the electron mobility of the fabricated polysilicon thin film transistor is high and the display performance of the display device is good.

Above are embodiments of the present application, which does not limit the scope of the present application. Any modifications, equivalent replacements or improvements within the spirit and principles of the embodiment described above should be covered by the protected scope of the invention.

What is claimed is:

1. A method for fabricating a thin film transistor, comprising:
    forming an active layer, a gate insulating layer, a gate, and a capacitive insulating layer sequentially on the substrate, the gate insulating layer isolating the active layer from the gate;
    forming a hydrogen-blocking layer on the side of the capacitive insulating layer facing away from the substrate, and the hydrogen-blocking layer covering the capacitive insulating layer; and
    performing hydrogenation treatment to the gate insulating layer and the active layer.

2. The method for fabricating a thin film transistor according to claim 1, wherein the temperature of the hydrogenation treatment is not more than 500° C. and the duration of the hydrogenation treatment is not more than 60 minutes.

3. The method for fabricating a thin film transistor according to claim 2, wherein the hydrogen-blocking layer is a conductive material, and after the step of performing hydrogenation treatment to the gate insulating layer and the active layer, the method further comprises: patterning the hydrogen-blocking layer to form a capacitive upper electrode.

4. The method for fabricating a thin film transistor according to claim 2, wherein after the step of performing hydrogenation treatment to the gate insulating layer and the active layer, the method further comprises: depositing a conductive material on a side of the surface of the hydrogen-blocking layer facing away from the substrate, and patterning the conductive material to form the capacitive upper electrode.

5. The method for fabricating a thin film transistor according to claim 3, wherein after forming the capacitive upper electrode, an interlayer insulating layer is formed on a side of the surface of the capacitive upper electrode facing away from the substrate, and a source and a drain are formed on the surface of the interlayer insulating layer.

6. The method for fabricating a thin film transistor according to claim 4, wherein after forming the capacitive upper electrode, an interlayer insulating layer is formed on a side of the surface of the capacitive upper electrode facing away from the substrate, and a source and a drain are formed on the surface of the interlayer insulating layer.

7. A thin film transistor, comprising: a substrate and an active layer, a gate insulating layer, a gate, and a capacitive insulating layer sequentially formed on a side of the substrate, wherein the thin film transistor is a hydrogen-blocking layer, and the hydrogen-blocking layer is disposed on a side of the capacitive insulating layer facing away from the substrate, and covering the capacitive insulating layer; and the hydrogen-blocking layer is for blocking the outwardly diffusion of the hydrogen ions provided by the capacitive insulating layer during the hydrogenation treatment.

8. The thin film transistor according to claim 7, wherein the thin film transistor further comprises a capacitive upper electrode, an interlayer insulating layer, a source, and a drain disposed on the side of the hydrogen-blocking layer facing away from the substrate, and the interlayer insulating layer isolates the capacitive upper electrode from the source and the drain on both sides of the interlayer insulating layer.

9. The thin film transistor according to claim 8, wherein the interlayer insulating layer is an organic material film layer.

10. The thin film transistor according to claim 7, wherein the hydrogen-blocking layer is an inorganic material film layer or a metal material film layer.

11. A display apparatus, comprising a thin film transistor, the thin film transistor comprising: a substrate and an active layer, a gate insulating layer, a gate, and a capacitive insulating layer sequentially formed on a side of the substrate, wherein the thin film transistor further comprises a hydrogen-blocking layer, and the hydrogen-blocking layer is disposed on a side of the capacitive insulating layer facing away from the substrate, and covering the capacitive insulating layer; and the hydrogen-blocking layer is for blocking the outwardly diffusion of the hydrogen ions provided by the capacitive insulating layer during the hydrogenation treatment.

12. The display apparatus according to claim 11, wherein the thin film transistor further comprises a capacitive upper electrode, an interlayer insulating layer, a source, and a drain disposed on the side of the hydrogen-blocking layer facing away from the substrate, and the interlayer insulating layer isolates the capacitive upper electrode from the source and the drain on both sides of the interlayer insulating layer.

13. The display apparatus according to claim 12, wherein the interlayer insulating layer is an organic material film layer.

14. The display apparatus according to claim 11, wherein the hydrogen-blocking layer is an inorganic material film layer or a metal material film layer.

* * * * *